United States Patent
Fujisawa

(10) Patent No.: US 7,295,139 B2
(45) Date of Patent: Nov. 13, 2007

(54) TRIGGERED DATA GENERATOR

(75) Inventor: Yasumasa Fujisawa, Kanagawa (JP)

(73) Assignee: Tektronix, Inc., Beaverton, OR (US)

( * ) Notice: Subject to any disclaimer, the term of this patent is extended or adjusted under 35 U.S.C. 154(b) by 25 days.

(21) Appl. No.: 11/359,010

(22) Filed: Feb. 21, 2006

(65) Prior Publication Data
US 2006/0202875 A1    Sep. 14, 2006

(30) Foreign Application Priority Data
Feb. 24, 2005  (JP)  ............... 2005-049069

(51) Int. Cl.
*H03M 9/00*  (2006.01)
(52) U.S. Cl. ...................... 341/100; 341/101
(58) Field of Classification Search ................ 341/100, 341/101, 147; 327/175, 263, 265
See application file for complete search history.

(56) References Cited

U.S. PATENT DOCUMENTS

| | | | |
|---|---|---|---|
| 4,631,484 A | 12/1986 | Malka et al. | |
| 4,729,024 A | 3/1988 | Kawai et al. | |
| 5,033,001 A * | 7/1991 | Ibi | 713/500 |
| 5,208,598 A | 5/1993 | Lueker et al. | |
| 5,224,129 A | 6/1993 | Lueker et al. | |
| 5,430,660 A | 7/1995 | Lueker et al. | |
| 6,111,925 A * | 8/2000 | Chi | 375/354 |
| 6,130,566 A * | 10/2000 | Yokomizo | 327/175 |

OTHER PUBLICATIONS

Compugen 1100, IBM PC Based High-speed Arbitrary Waveform Generator Card, 4 pages.
Lecroy PXA 125 Arbitrary Waveform Generator, Aug. 2002, 2 pages.
Tabor Electronics Ltd., 125MS/s PCIBus Arbitrary Waveform Generator, Model TE5300, 6 pages.

* cited by examiner

*Primary Examiner*—Brian Young
(74) *Attorney, Agent, or Firm*—William K. Bucher

(57) ABSTRACT

A triggered data generator reduces timing jitter at the start of serial data output from arrival of a trigger signal. A trigger detecting circuit 8 produces trigger phase information indicating the phase relationship between the trigger signal and a reference clock. A data pattern generating circuit 10 generates parallel data bits according to the reference clock in response to the trigger signal. A data shifting circuit 11 rearranges the parallel data bits in a predetermined order to produce shifted parallel data bits in which data bit order is shifted relative to the reference clock as a function of the trigger phase information. A parallel to serial converter 16 converts the shifted parallel data bits into serial data bits.

8 Claims, 4 Drawing Sheets

TRIGGERED DATA GENERATOR

BACKGROUND OF THE INVENTION

The present invention relates generally to data generators and more specifically to a fast data generator that starts data generation in response to a trigger signal.

Data generators store data patterns in memory and read the data patterns out as parallel data. The parallel data is then processed in a parallel state. However, the reading speed from the memory is not sufficient for higher speed data pattern signals. Therefore, the need for faster data patterns has resulted in the parallel data being read out of memory as parallel data and then converted into serial data to accelerate the data speed. The data generator usually starts data generation according to a trigger signal. The below described data generators fall into this category.

FIG. 1 is a block diagram of a conventional data generator. A clock generator 12 provides continuous clock CLK to a clock gate 14. The clock gate 14 passes the clock CLK according to a trigger signal. A parallel to serial converter 16 operates based on the gated clock. The parallel to serial converter 16 also provides a divided clock that is derived by dividing the gated clock CLK. A data pattern generation circuit 10 works according to the divided clock. The bit number of the parallel data defines a ratio of the division. For example, if the parallel data is four bits, the division ratio is four. The divided clock is also enabled by the trigger signal and then the data pattern generation circuit 10 provides the parallel data according to the trigger signal.

FIG. 2 is a block diagram of another conventional data generator. The same numbers indicate blocks corresponding to those of FIG. 1. A clock generator 12 provides continuous clock CLK to a parallel to serial converter 16. The parallel to serial converter 16 provides a data pattern generation circuit 10 with divided clock that is produced by dividing the clock CLK. The data pattern generation circuit 10 has a trigger input and starts providing parallel data for producing the serial data when it receives a trigger signal. The parallel to serial converter 16 converts the parallel data into serial data.

A circuit for generating pulses according to a trigger signal is disclosed in U.S. Pat. No. 5,430,660. The circuit uses a voltage-controlled oscillator (VCO) according to the trigger signal. However, the circuit cannot provide fast response because it makes the VCO oscillate according to the trigger signal.

Because the clock CLK (or divided clock) is provided after receiving the trigger signal, the phase of the clock is delayed relative to the trigger signal input. One conventional method of removing the delay is to use DLL (Delay Locked Loop) that intentionally delays at most one cycle to align the phases. But the triggered clock CLK and divided clock are not continuous in the example of FIG. 1 since they are gated according to the trigger signal so that the method using the DLL is not applicable.

On the other hand, the example of FIG. 2 uses the continuous clock and continuous divided clock so that the accelerating method using the DLL may be applicable. However, the time between arrival of a trigger signal and the start of the serial data output fluctuates widely because the divided clock decides the starting point for providing the serial data. For example, if the parallel to serial converter 16 performs a four to one conversion, the divided clock has a period that is four times longer than that of the clock CLK from the clock generation circuit 12. This means that the start point of the serial data relative to the trigger signal has uncertainty that is four times as that of the clock period.

Therefore what is desired is to reduce the uncertainty that is some times larger than a period of a clock for serial data while it keeps the advantage of the circuit of FIG. 2 that can use DLL.

SUMMARY OF THE INVENTION

The present invention is directed to a data generator that converts parallel data into serial data according to a predetermined order and output the data in response to a trigger signal. A trigger detecting means produces phase information indicating a phase relationship between the trigger signal and reference clock (divided clock). A data generating means generates parallel data according to the reference clock. A data shifting means rearranges the parallel data in predetermined order according to the phase information to produce shifted parallel data.

The data shifting means may have means for delaying each of the parallel data by one reference clock and combining data by current clock and the delayed data to produce the shifted parallel data. The trigger detecting means may generate phase-different clocks to the bit number of the parallel data, and sample the trigger signal by the phase-different clocks to generate the phase information.

The present invention reduces uncertainty to start of the serial data output from arrival of a trigger signal by shift operation of parallel data. Therefore serial data derived from the shifted parallel data by parallel to serial conversion, are provided with shorter delay from the arrival of the trigger signal than before.

The objects, advantages and other novel features of the present invention are apparent from the following detailed description when read in conjunction with the appended claims and attached drawings.

DETAILED DESCRIPTION OF THE INVENTION

Figure 1:
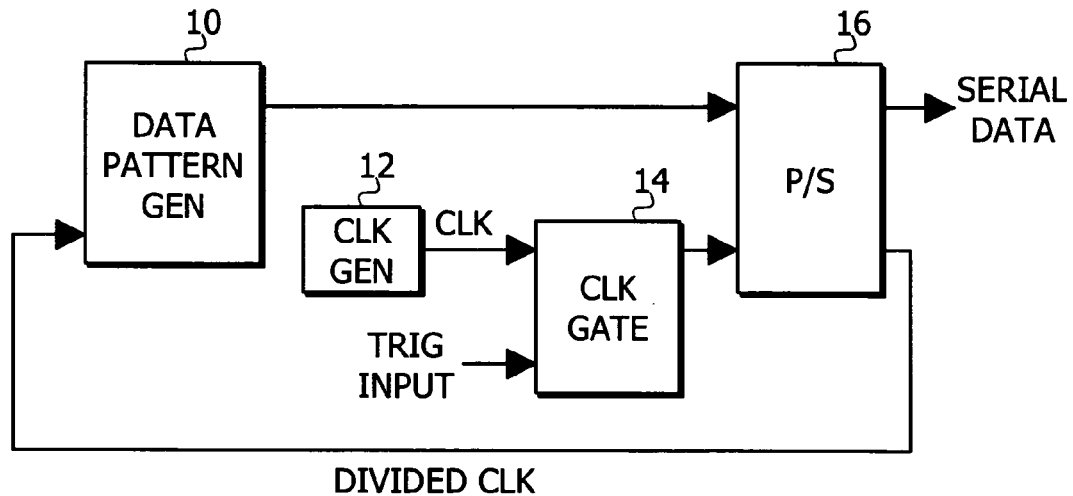
FIG. 1 is a block diagram of a conventional data generator.
Figure 2:
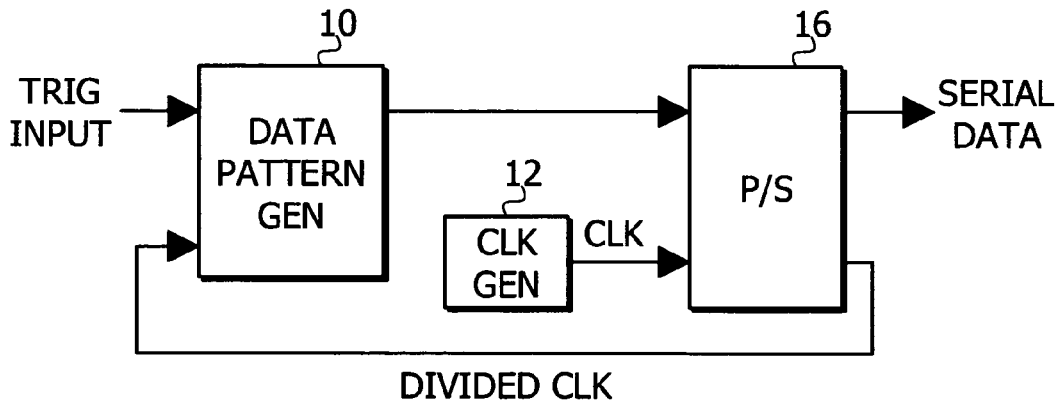
FIG. 2 is a block diagram of another conventional data generator.
Figure 3:
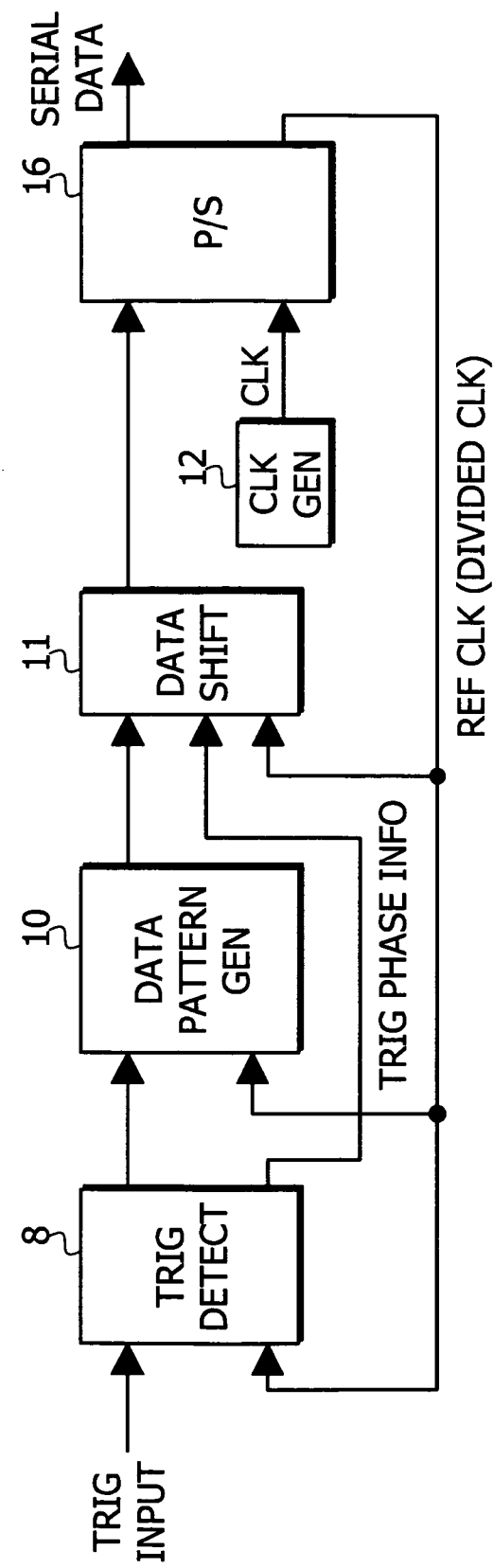
FIG. 3 is a block diagram of an embodiment of a data generator according to the present invention.

Referring to FIG. 3, there is shown a block diagran of a triggered data generator according to the present invention. A parallel to serial converter 16 provides serial data according to a clock (CLK) from a clock generator 12. The parallel to serial converter 16 also provides a divided clock output by dividing the clock CLK by the bit number of the parallel data. For example, if the parallel data has four bits, then the clock (CLK) from the clock generator 12 is divided by four. The divided clock will herein after be referred to as the reference clock. In the following descriptions, corresponding blocks in different FIGS. are indicated by the same numbers.

A trigger detector 8 receives a trigger signal and detects the phase of a trigger edge relative to the reference clock to provide trigger phase information and a signal indicating whether a trigger is effective or not. A data pattern generation circuit 10 receives the signal indicating whether the trigger is effective or not and starts to provide parallel data after the trigger becomes effective. A data shift circuit 11 receives the parallel data and the trigger phase information and changes the parallel data arrangement of the parallel data based on the trigger phase information. The modified parallel data is provide to the parallel to serial converter 16.

Figure 4:
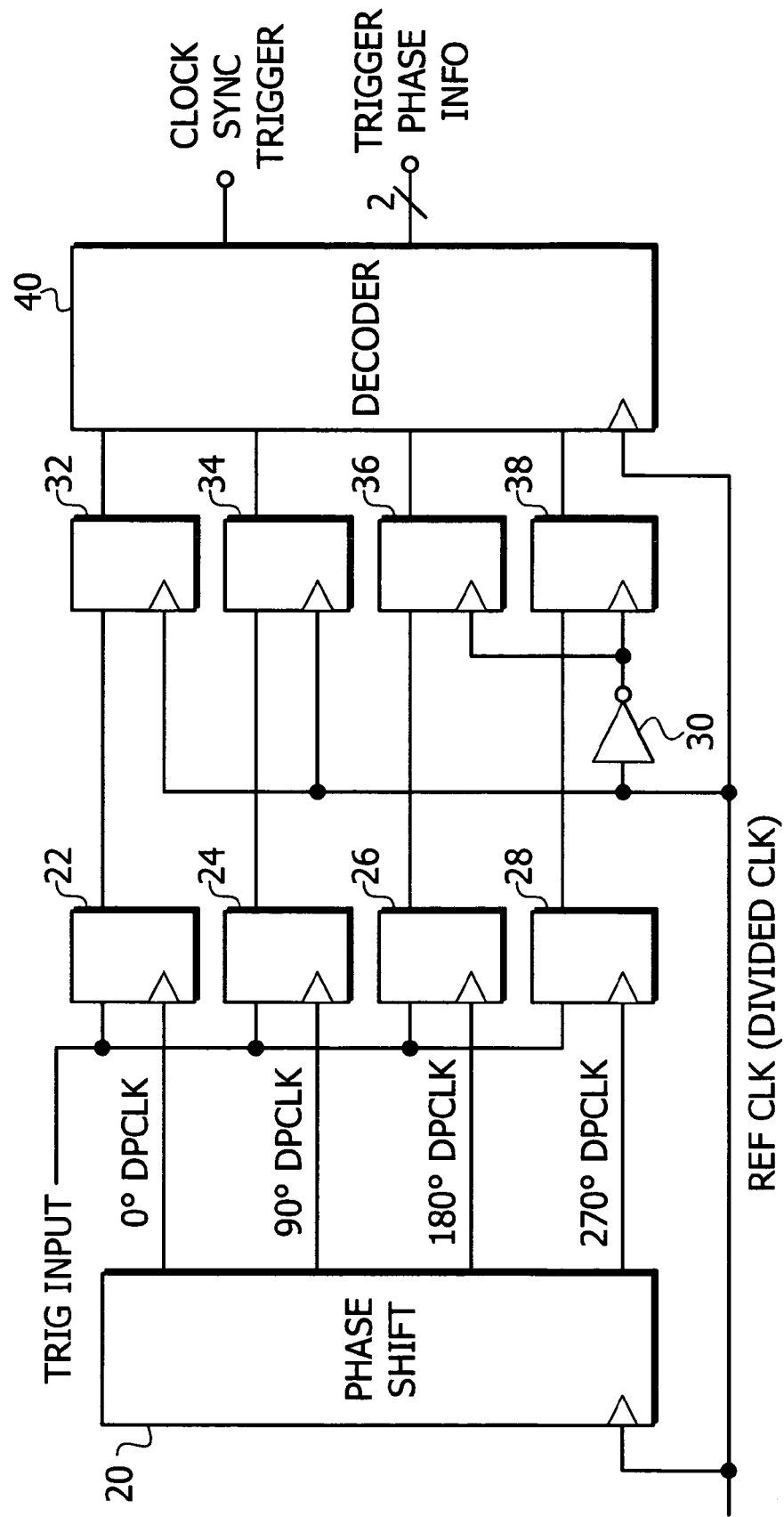
FIG. 4 is a block diagram of an embodiment of a trigger detector according to the present invention.

FIG. 4 shows an example of the trigger detector 8. A phase shift circuit 20 receives the reference clock and provides phase-shifted clocks "DPCLKs" (for example, 0, 90, 180 and 270 degrees) to the respective flip-flops 22, 24, 26, 28 to sample the trigger signal. The trigger signal is detected by one of the flop-flops 22, 24, 26, 28 as a function of the phase difference between the trigger signal and the phase-shifted clocks DPCLK. For example, if the trigger signal has a phase difference of 0 to 90 degrees to the reference clock, the flip-flop 22 will latch and be active. If the trigger signal has a phase difference of 90 to 180 degrees to the reference clock, the flip-flop 24 will latch and be active. If the trigger signal has a phase difference of 180 to 270 degrees to the reference clock, the flip-flop 26 will latch and be active. If the trigger signal has a phase difference of 270 to 360 degrees to the reference clock, the flip-flop 28 will latch and be active. The sampled trigger signal is synchronized at next stage flip-flops 32, 34, 36, 38 by the reference clock. A decoder 40 receives outputs of the flip-flops 32, 34, 36, 38 and when one of the outputs becomes active it provides a clock synchronized trigger signal that is synchronized with the reference clock indicating that the trigger is effective. The decoder 40 also provides trigger phase information data depending on which of the outputs of the flip-flops 32, 34, 36, 38 is active. In the example of FIG. 4, there are four phases and the trigger phase information data can be two bits and is provided to the data shift circuit 11. An inverter 30 is preferably included to provide the flip-flops 36 and 38 with an inverted clock that is 180 degrees different from that of the reference clock. This is because the flip-flop 28 receives a phase-different clock that is 270 degrees from that of the reference clock, and the flip-flop 38 might not have an enough time margin until the next reference clock comes if the inverter 30 were not. Because of the same reason, the flip-flop 36 may get the clock from the inverter 30.

Figure 5:
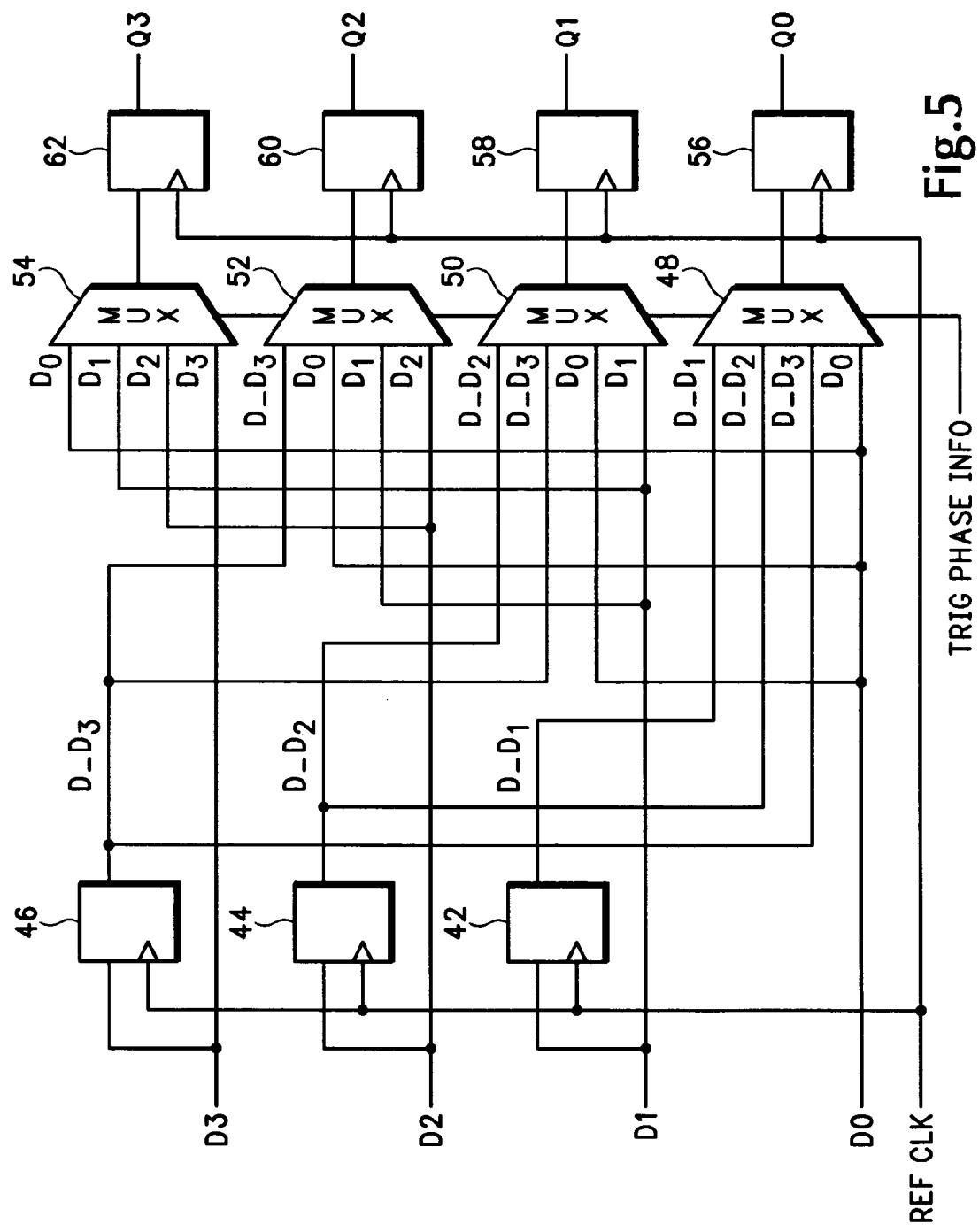
FIG. 5 is a block diagram of an embodiment of a data shift circuit according to the present invention.

FIG. 5 shows an example of the data shift circuit 11 that receives parallel data bits $D_0, D_1, D_2$ and $D_3$ from the pattern generator 10 and provides parallel data bits $Q_0, Q_1, Q_2$ and $Q_3$ to the parallel to serial converter 16. The parallel to serial converter 16 outputs serial data bits in order of $Q_0, Q_1, Q_2$ and $Q_3$. In this example, the smaller the suffix number of the data bits is the earlier the order is, and the earlier the reference clock is the earlier the order is. The serial data bits are provided according to this predetermined order.

Flip-flops 42, 44 and 46 respectively receive data bits $D_1$, $D_2$ and $D_3$ of the input parallel data and delay them by one clock of the reference clock to produce one-clock delayed (or previous) data bits $D\_D_1, D\_D_2$ and $D\_D_3$. The delayed data bits $D\_D_1, D\_D_2$ and $D\_D_3$ along with the parallel data bits $D_0, D_1, D_2$ and $D_3$ from the pattern generator 10 are selectively coupled to multiplexers 48, 50, 52 and 54. Each multiplexer 48, 50, 52 and 54 receives four of the data bits $D\_D_1, D\_D_2, D\_D_3, D_0, D_1, D_2,$ and $D_3$ and selectively provides one of the four data bits according to the phase information data to corresponding one of the flip-flops 56, 58, 60 and 62. The inputs of multiplexer 48 receive in ascending order, data bits $D_0, D\_D_3, D\_D_2$ and $D\_D1$. The inputs of multiplexer 50 receive in ascending order, data bits $D_1, D_0, D\_D_3$ and $D\_D_2$. The inputs of multiplexer 52 receive in ascending order, data bits $D_2, D_1, D_0, D\_D_3$ and the inputs of multiplexer 54 receive in ascending order, data bits $D_3, D_2, D_1,$ and $D_0$. The data bits on the flip-flops 56, 58, 60 and 62 are coupled to the parallel to serial converter 16 wherein the parallel to serial converter 16 outputs the serial data according to the phase relationship between the trigger signal and reference clock.

For example, if the trigger phase information indicates 0 degree delay, the phase difference between the trigger signal and the parallel data bits are deemed to fit in the 0 to 90 degree range, then relationship between the input and output data bits are processed as it has no modification as follows:

$Q_0=D_0, Q_1=D_1, Q_2=D_2, Q_3=D_3$

If the trigger phase information indicates 90 degree delay, the phase of the trigger signal is deemed to fit in the 90 to 180 degree range from an edge of the reference clock, then the output data bits are shifted by one data bit in relation to the input data bits as it is equivalent to 90 degree delay of the reference clock as follows:

$Q_0=D\_D_3, Q_1=D_0, Q_2=D_1, Q_3=D_2$ wherein $D\_D_3$ is the data bit delayed by one clock of the reference clock from the previous $D_3$. This process provides order-rearranged parallel data bits (shifted parallel data bits) delayed the equivalent of 90 degrees (=one fourth of four data bits of the parallel data bits) of the reference clock relative to the input original parallel data bits.

If the trigger phase information indicates 180 degree delay, the phase of the trigger signal is deemed to fit in the 180 to 270 degree range, then the output data bits are shifted by two data bits in relation to the input data bits as it is equivalent to 180 degree delay of the reference clock as shown below. Similar to the above case, the data bits $D\_D_2$ and $D\_D_3$ that are one-clock delayed data bits of $D_2$ and $D_3$ are used.

$Q_0=D\_D_2, Q_1=D\_D_3, Q_2=D_0, Q_3=D_1$

This produces order-rearranged parallel data bits (shifted parallel data bits) delayed the equivalent 180 degrees (=two fourths of four data of the parallel data) of the reference clock relative to the input original parallel data bits.

If the trigger phase information data indicates 270 degree delay, the phase of the trigger signal is deemed to fit in the 270 to 360 degree range, then the output data bits are shifted by three data bits in relation to the input data bits as it is equivalent to 270 degree delay of the reference clock as shown below. Similar to the above cases, the data bits $D\_D_1$, $D\_D_2$ and $D\_D_3$ that are one-clock delayed data bits of $D_1$, $D_2$ and $D_3$, are used.

$Q_0=D\_D_1, Q_1=D\_D_2, Q_2=D\_D_3, Q_3=D_0$

As described above, the present invention detects the phase relationship between a trigger signal and divided clock (reference clock) with greater accuracy than the period of the divided clock, and rearranges parallel data according to the phase relationship to produce shifted parallel data that is in a predetermined order. Therefore, it reduces the time fluctuation, or jitter, at the start the data output from arrival of the trigger signal. In the above examples, the present invention detects the phase relationship of the trigger signal and reference clock using four phases of the reference clock but there may be more reference clock phases depending on the bit number of the parallel data, which further reduces the time fluctuation. For example, if the bit number of the parallel data is 16, an equally dividable number, such as 8 or 16, etc, phases of the reference clock may be used. The present invention uses the divided clock continuously without gating, etc., which allows the use of a DLL, etc., to cancel phase delays by delaying the divided clock phase at most one clock to align it with a desired phase. Therefore, it does not sacrifice the speed of a circuit.

Briefly, the triggered data generator of the present invention reduces phase fluctuations between the input trigger signal and the output serial data resulting from the conversion of the stored parallel data into serial data in response to the trigger signal. A plurality triggered data generations of the present invention may be configured in a parallel arrangement for generating fast parallel data that is used to produce an analog signal through a digital to analog converter. Therefore, the present invention is suitable for generating a desired fast waveform signal reading the data from a memory according to a trigger signal.

What is claimed is:

1. A data generator producing serial data bits in response to a trigger signal comprising:
    means for detecting a phase relationship between the trigger signal and a reference clock by generating phase-shifted clocks of the reference clock that are a function of a parallel data bit count, and sampling the trigger signal by the phase-shifted clocks to produce a clock synchronized trigger signal and trigger phase information;
    means for generating the parallel data bits according to the clock synchronized trigger;
    means for shifting the parallel data bits in a predetermined order relative to the reference clock according to the trigger phase information to produce shifted parallel data bits; and
    means for converting the shifted parallel data bits into serial data bits.

2. The data generator recited in claim 1 wherein the data shifting means has means for delaying a selected number of bits of the parallel data bits by one clock of the reference clock and combining bits by the current reference clock and the bits delayed by one clock of the reference clock to produce the shifted parallel data bits as a function of the trigger phase information.

3. The data generator recited in claim 2 wherein the data shifting means has means for selecting the bits by the current reference clock and the bits delayed by one clock of the reference clock to produce the shifted parallel data bits in which the bits by the current reference clock and the bits delayed by one clock of the reference clock data are rearranged in the predetermined order as a function of the trigger phase information.

4. The data generator recited in claim 1 wherein the serial data bits are produced in response to a clock having a frequency that is a function of the number of the parallel data bits.

5. A method of generating serial data bits in response to a trigger signal comprising the steps of:
    detecting a phase relationship between the trigger signal and a reference clock by sampling the trigger signal using phase-shifted clocks of the reference clock that are a function of a parallel data bit count to produce a clock synchronized trigger and trigger phase information;
    generating the parallel data bits according to the clock synchronized trigger;
    shifting the bits of the parallel data bits in the predetermined order as a function of the trigger phase information to produce shifted parallel data bits relative to the reference clock; and
    converting the shifted parallel data bits into serial data bits.

6. The method for generating serial data bits recited in claim 5 wherein the shifting step further comprises the step of delaying a selected number of bits of the parallel data bits by one clock of the reference clock and combining bits by the current reference clock and the bits delayed by one clock of the reference clock to produce the shifted parallel data bits as a function of the trigger phase information.

7. The method for generating serial data bits recited in claim 6 wherein the combining step further comprises rearranging the parallel data bits in the predetermined order by selecting bits by the current reference clock and the bits delayed by one clock of the reference clock as a function of the trigger phase information.

8. The method for generating serial data bits recited in claim 5 wherein the serial data bits are generated in response to a clock having a frequency that is a function of the number of the parallel data bits.

* * * * *